United States Patent [19]

Spence

[11] 4,175,291
[45] Nov. 20, 1979

[54] NON-VOLATILE RANDOM ACCESS MEMORY CELL

[75] Inventor: Wendell Spence, San Jose, Calif.

[73] Assignee: NCR Corporation, Dayton, Ohio

[21] Appl. No.: 847,207

[22] Filed: Oct. 31, 1977

Related U.S. Application Data

[63] Continuation-in-part of Ser. No. 714,457, Aug. 16, 1976, abandoned.

[51] Int. Cl.² ............................................. G11C 11/40
[52] U.S. Cl. .................................... 365/184; 365/178; 307/238
[58] Field of Search ............... 365/174, 184, 222, 228; 307/238, 279

[56] References Cited
U.S. PATENT DOCUMENTS

| | | |
|---|---|---|
| 3,651,492 | 3/1972 | Lockwood ............................ 365/184 |
| 3,676,717 | 7/1972 | Lockwood ............................ 365/184 |
| 3,761,901 | 9/1973 | Aneshansley ........................ 365/184 |
| 3,771,148 | 11/1973 | Aneshansley ........................ 365/184 |

Primary Examiner—Terrell W. Fears
Attorney, Agent, or Firm—J. T. Cavender; Lowell C. Bergstedt; Philip A. Dalton

[57] ABSTRACT

A memory cell for a random access memory (RAM) having a volatile portion comprising an addressing transistor and a volatile storage capacitor, and a non-volatile portion comprising a non-volatile transistor and a transfer transistor. Normally the cell operates in a volatile storage mode without requiring operation of the non-volatile portion. As required, for example, upon loss of power, the data stored in the volatile capacitor is transferred to the non-volatile transistor. The transfer transistor controls the return of data to the capacitor in either the original or inverted form upon restoration of the power. In one exemplary embodiment, the cell is MNOS.

11 Claims, 9 Drawing Figures

NON-VOLATILE RANDOM ACCESS MEMORY CELL

This is a continuation-in-part of now abandoned U.S. application Ser. No. 714,457, entitled NON-VOLATILE RANDOM ACCESS MEMORY DEVICE, filed Aug. 16, 1976, in the name of Wendell Spence and assigned to the assignee of the present invention.

BACKGROUND OF THE INVENTION

This invention relates in general to random access memory devices and, more particularly, to a normally volatile random access memory cell having non-volatile storage capability.

MNOS (metal-nitride-oxide-semiconductor) technology is currently being used successfully to produce monolithic integrated circuits having static or dynamic memories. The static memory cell can be formed in a non-volatile configuration. An example of a non-volatile static RAM memory cell is taught in U.S. Pat. No. 3,651,492 issued Nov. 2, 1970, to George C. Lockwood and assigned to the assignee of the present invention.

However, the prior art dynamic RAM cells are volatile and normally comprise an addressing transistor and a volatile storage capacitor. Memories based upon these cells usually have an emergency power source for maintaining data storage in the event that the primary power is lost. The volatile dynamic RAM has to be refreshed very frequently (on the order of every two milliseconds) and thus requires considerable energy for extended power down conditions. In such a situation, non-volatile operation is preferable to volatile operation.

As will be appreciated from the above, it is desirable to have a dynamic RAM memory cell which can be operated in a non-volatile mode.

SUMMARY OF THE INVENTION

The present invention is an improved RAM cell which employs charge storage structures such as MNOS or SNOS structures and has combined aspects of volatile and non-volatile storage. The improved RAM cell comprises a storage device for volatilely storing signal information; an addressing device for controlling the input of information to the volatile storage device; an alterable-threshold, non-volatile storage device which can be selectively activated to a predetermined threshold state based upon the volatile information stored in the volatile storage device; and a transfer device for applying restoring signal information to the volatile storage device based upon the threshold state of the non-volatile storage device.

DESCRIPTION OF THE PREFERRED EMBODIMENTS

Figure 1:
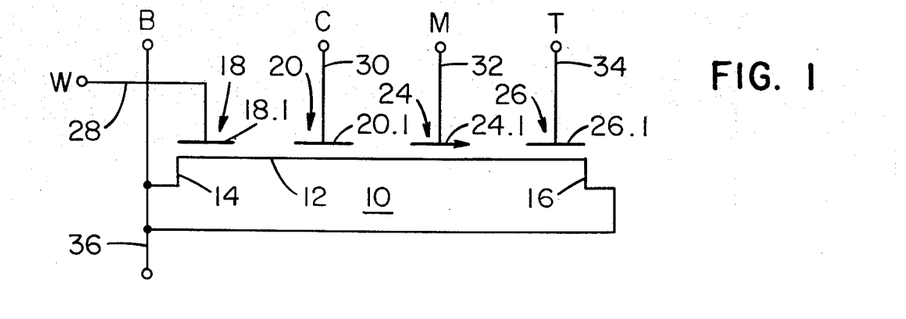
FIG. 1 is a schematic representation of one embodiment of a novel RAM cell embodying the principles of the present invention.

Referring now to FIG. 1, there is shown a schematic representation of a RAM cell 10 embodying the principles of the present invention and having diffused regions 14 and 16. In this embodiment, diffused regions or lines 14 and 16, respectively, are connected to line 36, herein labeled "B," while word line 28, labeled "W," is connected directly to gate metalization 18.1 of the typical volatile addressing transistor 18 required in a dynamic RAM. Adjacent addressing transistor 18 is volatile data storage capacitor 20 having electrode 20.1 connected to line 30, herein labeled "C". The other electrode of capacitor 20 is represented by channel area 12 of the semiconductor substrate on which the cell 10 is constructed. The combination of addressing transistor 18 and capacitor 20 provide the typical prior art dynamic RAM cell.

Adjacent capacitor 20 is an alterable, non-volatile, field-effect transistor 24. Transistor 24 may be an MNOSFET having a memory oxide of uniform thickness, or may be an MNOSFET having the dual gate or the trigate structure described in U.S. Pat. No. 3,719,866, which issued to Charles T. Naber and George C. Lockwood on Mar. 6, 1973, and is assigned to the assignee of the present invention. Line 32, labeled "M," connects to gate metalization 24.1 for controlling transistor 24. The schematic representation of gate 24.1 is shown with an arrow at one end thereof to indicate its non-volatile characteristics. The non-volatile characteristics, i.e., the ability to retain a memory state in the absence of any biasing gate voltage, is described in detail in the above-mentioned U.S. Pat. No. 3,719,866, which is hereby incorporated by reference.

Adjacent the non-volatile transistor 24 is a transfer transistor 26 having its gate 26.1 connected to line 34, herein labeled "T."

Figure 2:
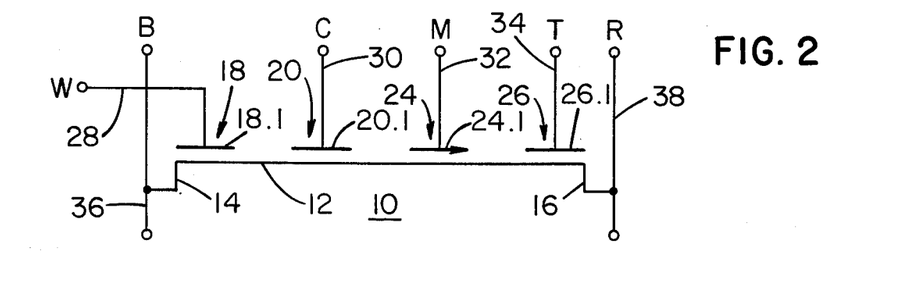
FIG. 2 is a schematic representation of another, preferred embodiment of a novel RAM cell embodying the principles of the present invention.

Referring now to FIG. 2, there is shown another embodiment of the dynamic RAM cell of the present invention, an embodiment 50 having a restore line 38, designated "R," in addition to the bit line 36. In this embodiment the functions of the bit line 36 of cell 10 of FIG. 1 are split between the bit line 36 and the restore line 38. In the P-channel MNOS embodiment 60 of the cell 50 shown in FIG. 5, the structure of cell 60 duplicates that of cell 10, except that the ends of cell 60 are connected to different P+ diffusion lines.

In a memory array of cells 60—60, adjacent cells share the diffusion lines so that diffusion line 14 is both the bit line for the cell 60 shown in FIG. 5, and is also the restore line for the adjacent cell above cell 60, while line 16 is the restore line for the cell 60 and is the bit line for the adjacent cell below cell 60. Thus, although separate lines 14 and 16 provide the bit and restore functions to a particular cell, and although the description herein and the waveform diagrams of FIGS. 8 and 9 describe lines 14 and 16 in terms of their separate, bit and restore functions for ease of understanding, at any given time each of the lines 14 and 16 is providing the same, bit or restore function, but to different ones of the cells 60. Because of this sharing of the bit and restore functions in cell 60, both of the lines 14 and 16 are at the same potential during store and restore operations. Of course, those skilled in the art will readily develop embodiments in which the bit and restore lines are truly physically separate.

Cell 50 and embodiment 60 thereof are more versatile than cell 10 in the application of density-increasing device design and construction thereto and are thus the more preferred embodiments.

Where necessary to aid understanding of the operation of the cell 10, lines 14 and 36, and 16 and 38 will be referred to by their function, and/or by function and numerical designation rater than by numerical designation, e.g., by "bit line" or "bit line 14," and "restore line" or "restore line 16," rather than as lines 14 and 16. Also, the lines 28, 30, 32, and 34 for applying voltage to the gates of addressing transistor 18, volatile storage capacitor 20, non-volatile or memory transistor 23, and transfer transistor 26, respectively, will be designated by their function or functional association, i.e., by "word line 28" or "W line 28", "capacitor line 30" or "C line 30", "memory line 30" or "M line 30", and "transfer line 34" or "T line 34".

Figure 4:
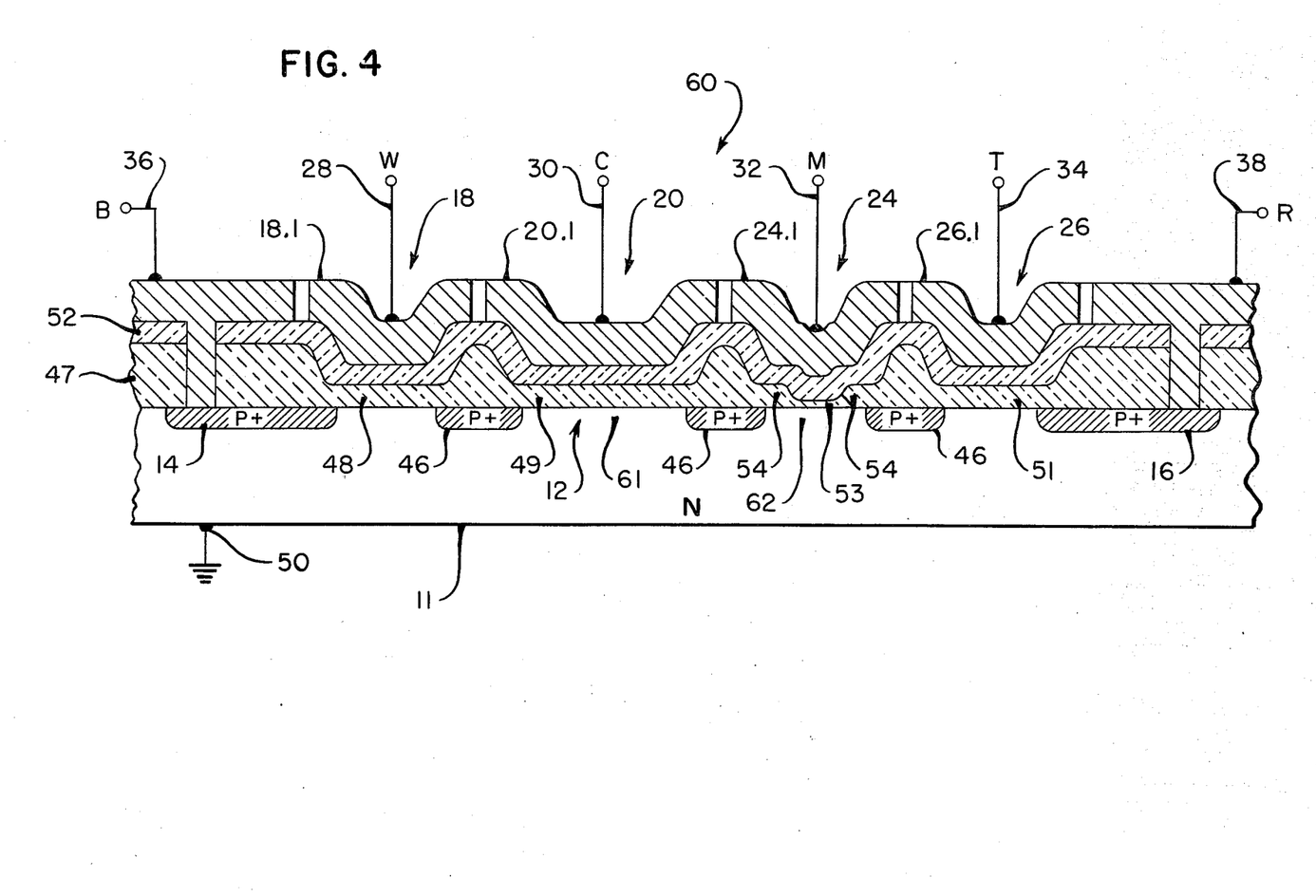
FIG. 4 is a cross-sectional representation, partly in schematic, of a P-channel embodiment of the RAM cell shown in FIG. 2.
Figure 5:
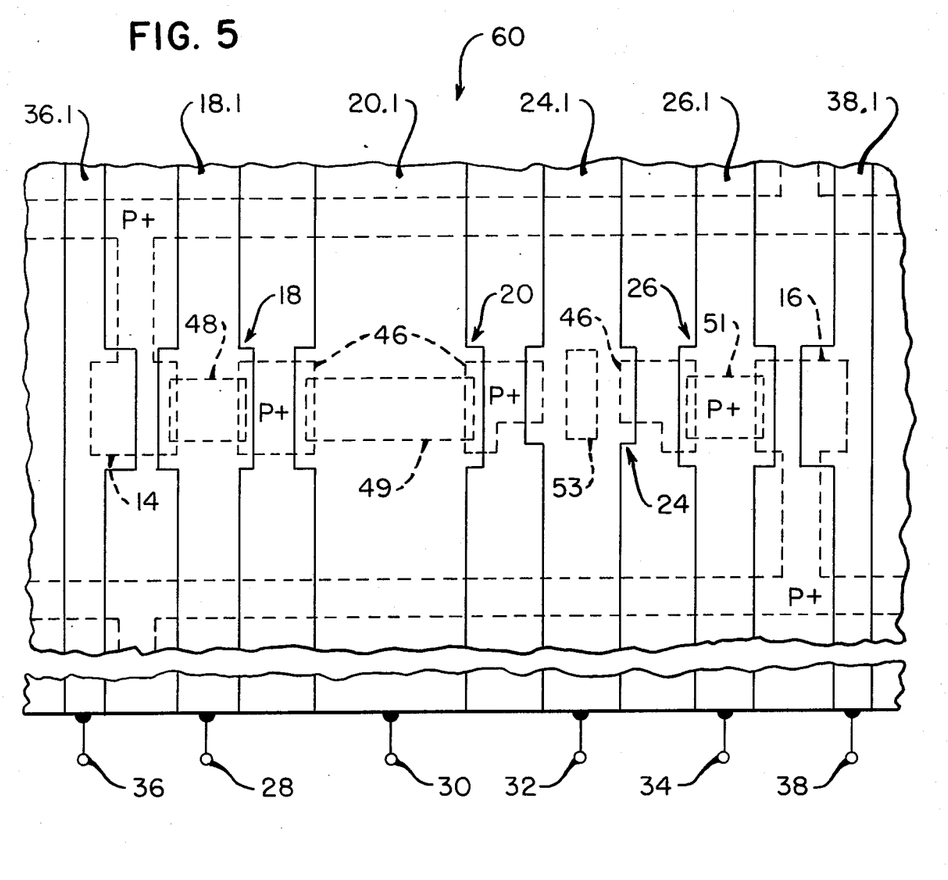
FIG. 5 is a plan view, partly in schematic, of the P-channel RAM cell of FIG. 4.

Referring now to FIGS. 4 and 5, and, especially to FIG. 4, there is shown a P-channel embodiment 60 of the cell 50 of FIG. 2. The device is formed on N-type substrate 11 and has permanent P+ channel diffusions 46—46 for connecting the portions of the channel 12 formed during the operation of the various devices. Bit and restore lines 14 and 16 are P-type also. A thick, protective coating 47 of field oxide formed on the substrate 11 provides electric isolation for the substrate and the devices. Devices 18, 20, and 26 all may comprise a gate insulator structure suitable for volatile, fixed threshold transistor action: oxide layers 48, 49 and 51, typically about 450 Angstroms thick, and silicon nitride layer 52, typically about 400 Angstroms thick. Conduction may then be established in the channel regions under the oxide-nitride gate insulators by using lines 28, 30, and 34 and substrate electrode 50 to establish a potential difference between the electrodes or gates 18.1, 20.1, and 26.1, respectively, and the substrate. Typically, the electrodes or gates 18.1, 20.1 and 26.1 are of a good conductor such as aluminum.

As mentioned previously, the P+ diffusion regions 46—46 connect the portions of the conduction channel 12 formed during operation of the various devices. Examples are channel portions 61 and 62 associated with capacitor 20 and memory transistor 24. The diffusion regions 46—46 are not provided to serve as source and drain for the various devices. Rather, the diffusion regions 46—46 are required to complete the channel 12 because of the space between adjacent gates or electrodes, such as gates 26.1 and 24.1, or gate 24.1 and electrode 20.1. The diffusion regions 46—46 can be eliminated by using overlapping gates or electrodes which are separated by insulation. SNOS (silicon-nitride-oxide-semiconductor) technology is particularly useful for this approach.

It is evident from FIG. 4 that capacitor 20 is structurally similar to transistors 18, 24, and 26, and could be designated a transistor or a data storage transistor. However, capacitor 20 and transistors 18, 24, and 26 are not conventional three-terminal (source, drain and gate) FETs (field-effect transistors) or MNOSFETs, for they do not use a source or drain. It is evident from the mode of operation described below that the operation of devices 18, 20, 24, and 26 utilizes both CCD (charge coupled device) and transistor principles. For simplicity of nomenclature, however, the devices 18 and 20, 24 and 26 are referred to throughout as a capacitor and transistors, respectively.

Memory transistor 24 is illustrated as an MNOS trigate structure having a thin, memory oxide section 53 of about 15–60 Angstroms thickness, intermediate end oxide sections 54—54, which typically are about 450 Angstroms thick. The memory oxide layer 53, which is very thin and has a low concentration of charge trapping centers, allows tunneling of charges to and from the substrate, while the silicon nitride layer has a high concentration of charge trapping centers. Upon application of a suitable bias voltage via M line 32 to gate 24.1 (which is, e.g., aluminum) of the memory transistor 24, the memory oxide layer 53 and the silicon nitride layer 52 cooperate to store charges which have tunneled from the substrate and/or release charges which tunnel to the substrate, to establish the value of the threshold voltage, $V_T$, of the memory transistor. Also, the thick oxide sections 54—54 impede zener breakdown of the transistor and tend to prevent depletion operation.

The threshold voltage will remain at the established value indefinitely despite removal of the bias voltage. This characteristic is the basis for the term "non-volatile." By judicious choice of the biasing voltages, the transistor can be set to different threshold voltages which represent different binary states and thus provide memory storage. The RAM cell 60 uses these characteristics as described infra, to provide non-volatile storage of data in the volatile RAM portion of the cell.

Mode of Operation

In the ensuing description of the operation of the exemplary non-volatile dynamic RAM cell 60, the following definitions will apply. When a line or element is driven "low", it is intended that this line or element be at ground potential, 0 v. When a line or an element is driven "high" it is intended that this line or element be maintained at −12 v., unless specified otherwise.

Volatile Operation

Figure 6:
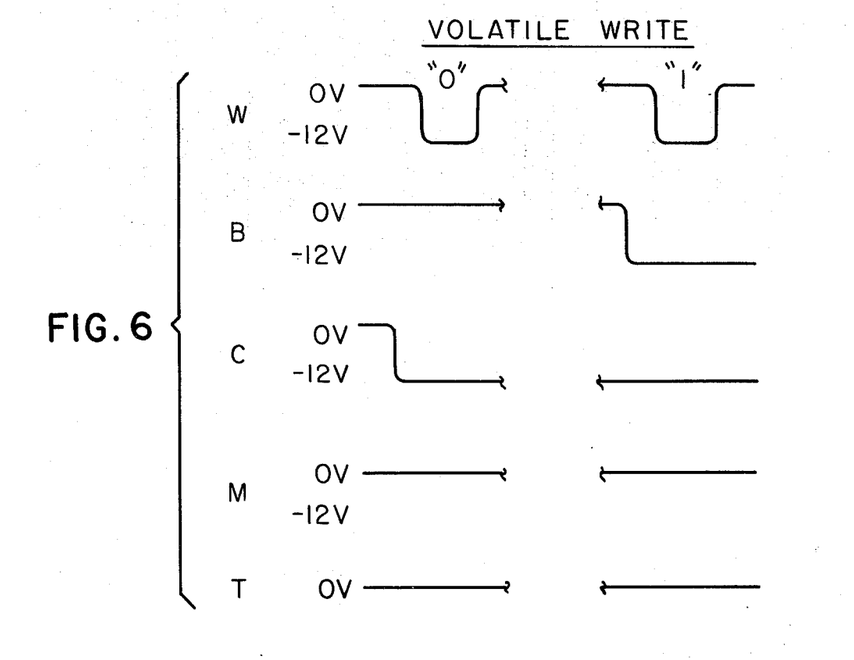
FIG. 6 illustrates voltage waveforms useful during the normal, volatile writing operation of the P-channel cell of FIG. 4.

Referring now to FIG. 6, when it is desired to "write" capacitor 20 to 0 v. during normal volatile operation of the cell 60, gate 18.1 of access transistor 18 is driven high by word line 28, bit line 14 is driven low by line 36 and electrode 20.1 of capacitor 20 is driven high by line 30. Gate 24.1 of memory transistor 24 and gate 26.1 of transfer transistor 26 are driven or maintained low. Since driving the gate 18.1 of access transistor 18 high causes transistor 18 to conduct, the potential $\phi_C$ of channel region 61 of capacitor 20 will be placed at the same potential, 0 v., as bit line 14, and the capacitor is thereby charged or polarized. The charged or polarized condition is arbitrarily chosen as the "0" binary state. At this point, it should be obvious that addressing transistor 18 and capacitor 20 may be used together as a volatile, dynamic RAM cell.

When it is desired to write addressing transistor 18 to a "1" binary state, here chosen to be −12 v., word line 28 and capacitor line 30 are again driven high, but bit line 36 is driven high also. The gates of memory transistor 24 and transfer transistor 26 are again held or driven low. As in the "0" state, addressing transistor 18 is driven to conduction by the voltage applied via word line 28, and the potential $\phi_C$ of channel region 61 of the capacitor 20 is placed at about the same potential as bit line 14. In this case, the bit line 14 is at −12 v. and the capacitor 20 is written to about the −12 v., "1" state with the capacitor 20 unpolarized.

The bit line potential of −12 v. actually writes capacitor 20 to a potential of less than −12 v. This is because (disregarding other effects) $\phi_C$ is approximately by the difference between the bit line potential and the threshold voltage, $V_T$, of capacitor 20. For a bit line potential of −12 v. and $V_T = -3$ v., $\phi_C = -9$ v. For simplicity and ease of understanding, the surface potentials herein are referred to as being approximately the values of the potentials applied, e.g. by the bit line, but the effect of $V_T$ on such approximations should be remembered.

FIG. 6 shows the voltage waveforms which write the capacitor 20 to the "0" and "1" states. To reiterate concerning the volatile operation of cell 60, the capacitor 20 is written to a "0" state by driving electrode 20.1 of the capacitor and gate 18.1 of access transistor 18 to −12 v., while line 36 is used to drive or hold bit line 14 at 0 v. The capacitor 20 is written to a "1" state by driving electrode 20.1 and gate 18.1 to −12 v. and using line 36 to drive bit line 14 to −12 v. also. In effect, binary information in the form of 0 v. or −12 v. signals is transferred from the bit line 14 to the capacitor 20 to charge the capacitor to a given binary state.

Store

There are times when the mains will be shut off or power otherwise interrupted. In such a situation, it is highly desirable that the information volatilely stored in capacitor 20 be shifted and stored in non-volatile fashion, i.e., without the use of emergency power for refreshing the stored data. The cell 60 accomplishes this by storing the data in non-volatile memory transistor 24. This is done by driving the gate 24.1 of memory transistor 24 to a large negative voltage, e.g., −25 v., and a short time later, driving the electrode 20.1 of the capacitor 20 low while the gate 18.1 of addressing transistor 18 is held low. It will be obvious to those skilled in the art that since the usual volatile RAM cell can retain data for only a few milliseconds after power failure, a sensing circuit will be required, and will be readily implemented, to promptly initiate the storage operation in the event of an inadvertent or undesired power failure.

Figure 7:
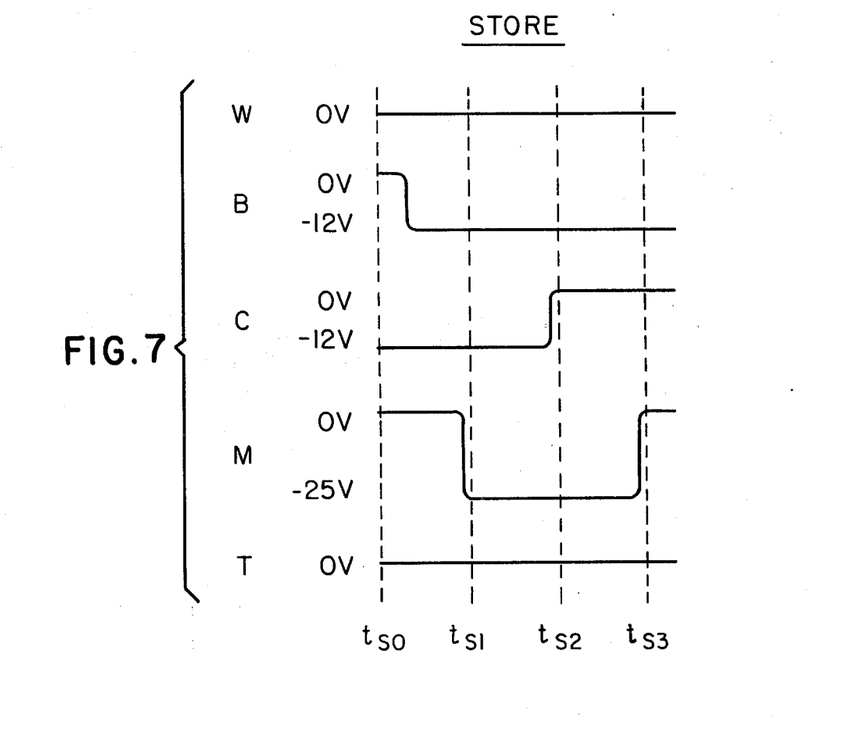
FIG. 7 illustrates voltage waveforms useful during the non-volatile storage operation of the P-channel RAM cell of FIG. 4.

FIG. 7 shows illustrative waveforms which are used to transfer or store data from the capacitor 18 to alterable, non-volatile memory transistor 24. The Figure is divided into time increments $t_{SO}$–$t_{S3}$. It is not intended that the increments of FIG. 7 or the other waveform diagrams necessarily represent equal divisions of time.

Consider first the transfer of a "0" from the capacitor 18 to memory transistor 24. This assumes that at the initiation of power down, at time $t_{SO}$, (1) memory transistor 24 has been previously erased to a threshold voltage of, e.g., $V_T = -3$ v.; (2) the potential of $100_C$ of channel region 61 of the capacitor has been written to 0 v., (using C of −12 v., W of −12 v., B of 0 v., see FIG. 5) or refreshed to 0 v.; and (3) after the write or refresh operation, W line 28 has been driven low and C line 30 is still high. It is irrelevant whether bit line 14 is low or high, since access transistor 18 is inoperative and terminates the connection between the capacitor channel and the bit line.

Immediately upon power down, to provide maximum charge in the capacitor 20 for effective transfer of data therein, all capacitors within the memory are refreshed, then within about two milliseconds after the refresh, at time $t_{S1}$, M line 32 drives the gate 24.1 of memory transistor 24 hard, to −25 v. Initially, the surface potential, $\phi_M$, of channel region 62 of the memory transistor 24 is driven toward −25 v. by the applied voltage. The potential $\phi_C$ of capacitor channel 61 is at 0 v. as stated previously. The capacitor channel thus contains a large concentration of holes (minority charge carriers). The approximately −25 v. potential of the memory transistor channel 62 attracts and shares these holes.

Next, at time $t_{S2}$, the C line 30 is driven low and drives the capacitor electrode 20.1 to 0 v. The capacitor now no longer attracts the holes to the capacitor channel and, in fact, the capacitor gate voltage of 0 v. repels the holes from the capacitor while the negative memory transistor voltage attracts the holes to the memory transistor. This process quickly transfers sufficient holes to the channel of memory transistor 24 to raise the potential $\phi_M$ sufficiently near 0 v. to cause tunneling between the oxide 53-nitride 52 interface of the gate insulation and the substrate 11 to write the memory transistor. Typically, for a gate voltage of about −25 v., and a channel surface potential $\phi_M$ of about 0 v., the resulting 25 v. potential difference will write the memory transistor to a threshold voltage of about −10 v.

In the event the capacitor 20 was in the "1" state (approximately −12 v.) at power down, no holes have been attracted to the capacitor channel and there are no holes to transfer to the memory transistor channel when the memory gate receives a write voltage and the capacitor is driven low. The memory transistor surface potential $\phi_M$ stays at about −25 v., approximately the same voltage as the gate 24.1 thereof, and there is insufficient potential across the oxide-nitride interface for tunneling. The memory transistor 24 thus remains in the erased state of $V_T = -3$ v.

To summarize, during the store operation, "0" (0 v.) or "1" (−12 v.) volatile capacitor datum is translated into a non-volatile, written ($V_T = -10$ v.) or erased ($V_T = -3$ v.) memory transistor state, respectively. The written and erased states which result from transferring "0" and "1" data from capacitor 20 to the memory transistor 24 control the transfer of data back to the capacitor during the restore operation, described infra.

It should be noted that during the storage of "1" state data into the memory transistor 24, the tunneling-precluding surface potential $\phi_M$ lasts only a relatively few milliseconds. Under typical ambient conditions, holes (the minority carriers in the N-type substrate 11) are continually being released by thermal generation and/or the absorption of ionizing radiation. The minority charge carriers drift up to, are attracted to, the memory transistor 24 and within a short time, approximately 10–20 milliseconds, raise the surface potential $\phi_M$ toward 0 v. The resulting potential difference across the gate insulator causes the memory transistor 24 to be written. This unwanted writing can be precluded by completing the store transfer operation within a few milliseconds and then removing the voltage from the memory transistor gate 24.1, as indicated at time $t_{S3}$. Alternatively, of course, ambient temperature and light can be controlled to preclude this writing.

Having stored the information in non-volatile memory transistor 24 and since transistor 24 does not require periodic refreshing, the stored information will be maintained for months or years or until such time as it is desired to transfer the information back to the dynamic RAM portion of cell 60 for use therein.

Restore

The restoration of data from the memory transistor 24 to the capacitor 20 is accomplished in either inverted or noninverted fashion. To restore the information in an inverted fashion in capacitor 20, one precharges word line 28, bit line 36, and capacitor line 30 "high". Word line 28 and bit line 36 are then driven "low" while maintaining capacitor line 30 "high." Transfer line 34 is then driven "high" and memory line 32 is driven to −6 v., causing memory transistor 24 to transfer an inverted charge back to the capacitor 20.

Figure 8:
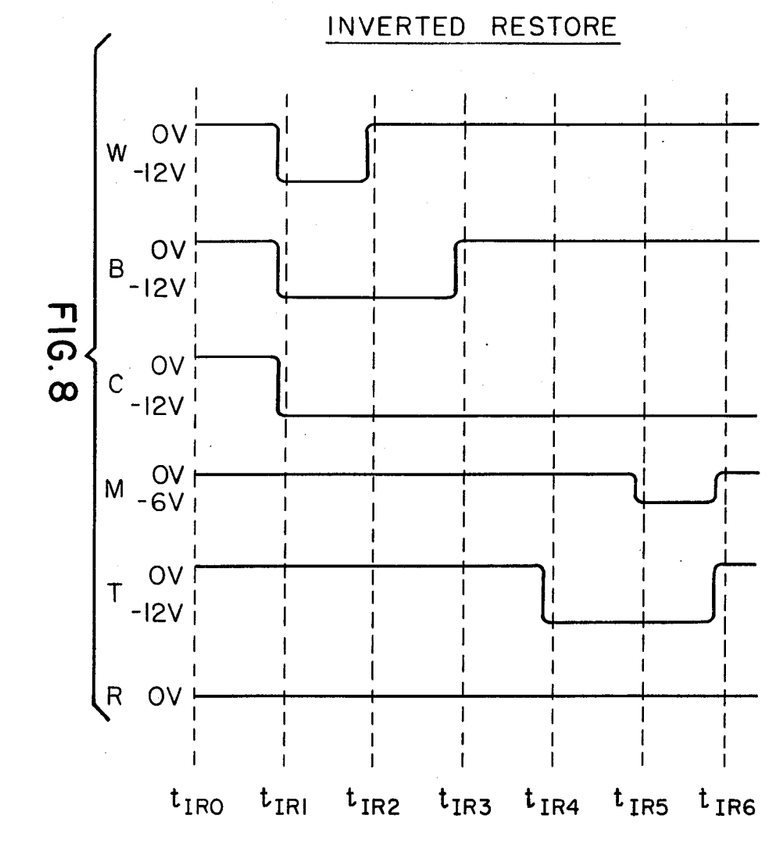
FIG. 8 illustrates voltage waveforms useful during the inverted restore operation of the P-channel RAM cell of FIG. 4.

To amplify regarding the inverted restore, consider the voltage waveforms shown in FIG. 8. FIG. 8 is divided into time intervals $t_{IR0}-t_{IR6}$. Initially, at time $t_{IR0}$, all lines and gates (W, B, C, M, T and R) are at the 0 volts power down condition. At $t_{IR1}$ capacitor 20 is initialized to the "1" state preparatory to restoration. This is done by applying −12 v. to both the line 36 to place bit line 14 at −12 v., and also to the word line 28 to turn on address transistor 18 to connect the bit line to the capacitor channel 61. The surface potential $\phi_C$ of the capacitor 20 is thereby brought to −12 v. and the capacitor is written to the unpolarized "1" state.

After initializing the capacitor, at $t_{IR2}$ the activating signal to the address transistor 18 is terminated to disconnect the capacitor 20 from the bit line 14. At $t_{IR3}$ the bit line may be driven to 0 v. At $t_{IR4}$, transfer transistor 26 is activated by a −12 v. gate signal applied via T line 34 to connect the channel region 62 of the memory transistor 24 to the restore line 38, which is at 0 v. At this point, the bit and restore lines are at 0 v., the gate 26.1 of transfer transistor 26 is at −12 v., the gate 24.1 of memory transistor 24 is at 0 v., and the gate 20.1 of the capacitor 20 is also at −12 v.

At $t_{IR5}$, a read voltage that is about halfway between the −3v. and −10 v. threshold voltages of the memory transistor 24 is applied by M line 32 to the memory gate 24.1. If the memory transistor threshold voltage $V_T$ is −3 v., this −6 v. signal will cause the memory transistor to conduct. The memory transistor 24 and transfer transistor 26 then apply the 0 v. restore line 16 to the −12 v. capacitor channel 61 so that the capacitor channel is discharged to 0 v. Consequently, the original "1" state has been translated into an erased memory transistor, then restored, inverted, to a "0" capacitor state. If $V_T$ is −10 v., the memory transistor will not conduct when the −6 v. read voltage is applied and the channel region of the capacitor C will remain at −12 v. In this case the original "0" capacitor state has been translated into a written memory transistor state, then restored, inverted, to a "1" capacitor state.

One of the advantages of the inverted restore operation is the relative insensitivity to degradation of the threshold voltage, $V_T$, if the read voltage is chosen properly. For example, if the initial threshold voltage is either −3 v. or −10 v., use of the exemplary −6 v. interrogate signal will give a proper restore even if the threshold voltage has degraded from −3 v. to −5 v., or from −10 v. to −7 v.

Furthermore, the memory transistor 24 is used relatively infrequently, i.e., during only the non-volatile store and restore operations, and degradation is thus minimized for both the inverted and non-inverted modes of operation.

As mentioned above, the capacitor 20 is restored in inverted fashion: an original 0 v. or −12 v. surface potential in the channel region 61 of the capacitor at power shutdown is restored to −12 v. or 0 v., respectively. This requires that the RAM circuitry recognize the inversion or perhaps apply a double restoration operation to invert the inverted data and thereby provide the non-inverted original data. Either choice can be readily implemented.

If it is desired to restore information to capacitor 20 without inversion, one precharges the capacitor by driving word line 28 and capacitor line 30 "high" while bit line 36 is driven or maintained "low". Memory line 32 and transfer line 34 are also driven or held "low". Word line 28 is driven "low", while maintaining capacitor line 30 "high". Memory line 32 is driven to −10 v. and transfer line 34 is driven "high" and, by source follower action, $\phi_C$ goes to −10 v. (reduced by $V_T$ of transistor 24). The cell 60 will now function in the normal dynamic RAM mode which requires periodic refreshing, but has the capability of storing information at will.

Figure 9:
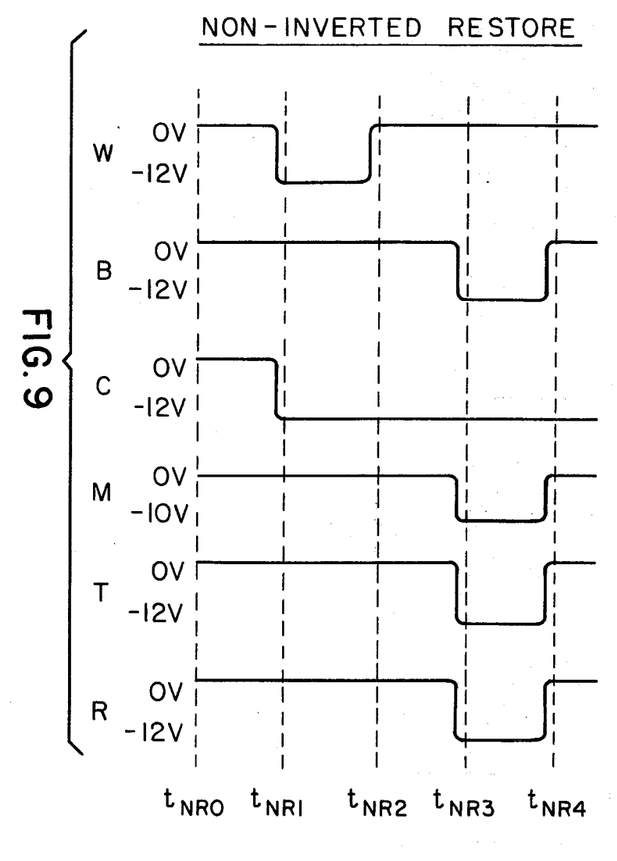
FIG. 9 illustrates voltage waveforms useful during the non-inverted restore operation of the P-channel RAM cell of FIG. 4.

To amplify concerning the non-inverted mode of operation, refer to FIG. 9. There is shown waveforms useful for the non-inverted mode of operation. Time increments are denoted $t_{NR0}-t_{NR4}$. The power down condition at which all components are at ground potential is indicated at time $t_{NR0}$. At $t_{NR1}$, the word line 28 and capacitor line 30 are set to −12 v. to activate address transistor 18 and capacitor 20, and the bit line 14 is set to (retained at) 0 v. to drive the potential $\phi_C$ of the capacitor channel region 61 to 0 v. This initializes the capacitor by writing it to the charged "0" state.

The address transistor 18 is then inactivated, at $t_{NR2}$, by driving the word line 28 to 0 v. The restore line and the gate 26.1 of the transfer transistor 26 are now set to −12 v. to reverse the potential across the memory transistor. See $t_{NR3}$. At this point, the left side and the right side of the memory transistor channel 62 are at 0 v. and −12 v., respectively.

The restore is completed by applying −10 v. to the gate 24.1 of the memory transistor (also at time $t_{NR3}$, if desired). If $V_T$ is −10 v., the memory transistor will not quite conduct, the channel region of capacitor 20 will remain at 0 v., and the original "0" capacitor state will be restored.

However, if the threshold of the memory transistor 24 is in the erased, −3 v. state, applying −10 v. to the gate 24.1 turns the memory transistor on and results in the source thereof going to −7 v. The channel region of the capacitor 20 is then charged to −7 v., and the capacitor is thus rewritten to a negative potential.

In summary, the channel region of the capacitor 20 will either be at 0 v. or −7 v., depending upon whether −3 v. or −10 v. was written into the memory transistor. In terms of the magnitude of the restored charge, the non-inverted −7 v. restore is not quite as complete a restore as the −12 v. provided by the inverted mode of operation. However, the non-inverted restore has the advantage that the capacitor 20 is restored to the same polarity as that existing at power down. Moreover, the −7 v. restore charge may be restored fully to −12 v. during the refresh operation.

After restoration is complete, the cell may be prepared for a subsequent refresh operation by turning off all components except capacitor 20, as shown at time $t_{NR4}$. The electrode 20.1 of the capacitor is kept biased to retain the data in the capacitor.

For the standard volatile memory portion of the cell 60, refreshing must commence within about two milliseconds of the completion of restoration and continue every two milliseconds in order to maintain the state of capacitor 20. With the transfer gate 26.1 and the memory gate 24.1 at 0 v., the address transistor 18 is turned on by the word line 38 and the charge stored in the capacitor 20 is read out along the bit line 36 and into a sensing device. In the case of the non-inverted "1" restoration, those skilled in the art will readily apply the circuit necessary to refresh the −7 v. charge to −12 v. At this point, the cell 60 is returned to a normal volatile mode of operation.

Figure 3:
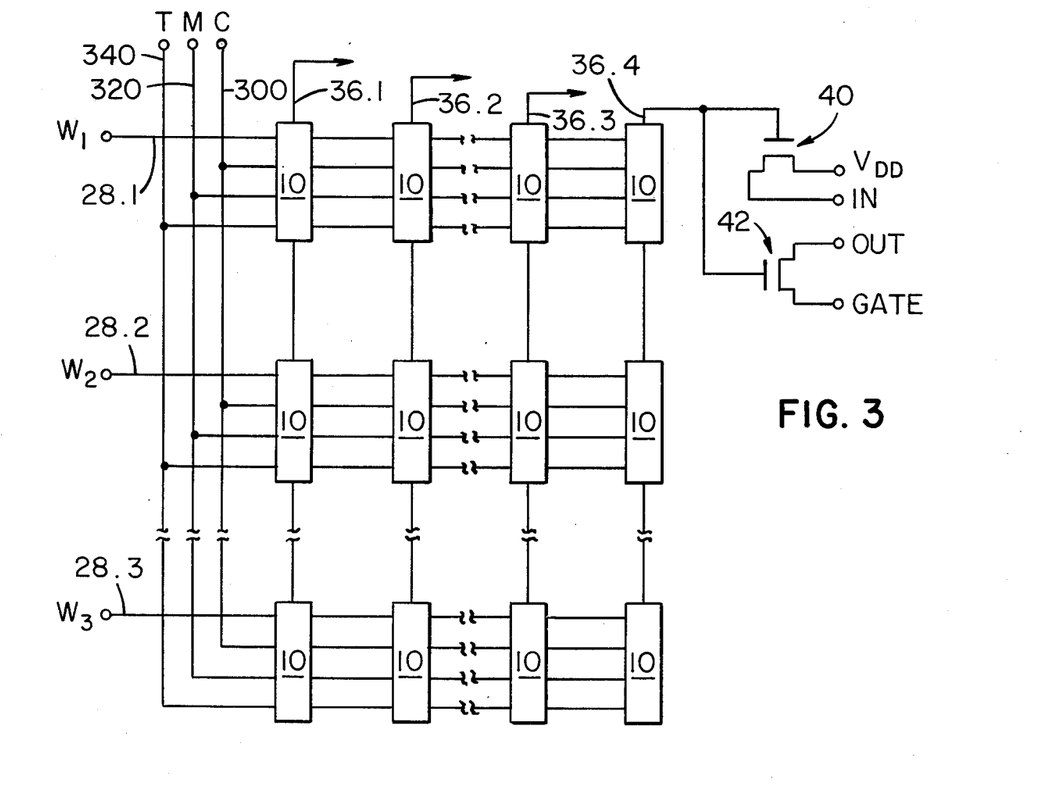
FIG. 3 is a schematic representation of a typical memory array of RAM cells of the present invention arranged in a matrix of rows and columns.

Referring now to FIG. 3, there is shown a memory cell array which utilizes cell 10. Cell 20 or cell 60 could be used in a similar manner. Each bit line in a common column is connected to a common line 36.1, 36.2, 36.3, and 36.4 while each word line in a common row is connected to a common line 28.1, 28.2, and 28.3, respectively. Thus, a particular memory cell may be designated and accessed by its position in the array. As an example, if it is desired to access the cell in the lower left-hand corner of the array, one accesses by means of word line 28.3 and bit line 36.1.

The gates of the capacitors 20—20 in all of the cells 10 are connected to line 300, while the gates of the memory transistors 24 are connected to line 320. Similarly, the gates of all transfer transistors 26 are connected to line 340. With this arrangement, the device 10 can be block stored or block erased very conveniently.

To further illustrate the organization of a memory array, a differential sense amplifier 42 for sensing output data is schematically shown while an input driver 40 for entering data into the memory is also shown. There ordinarily will be a sense amplifier 42 associated with each column of cells in the memory array, but for simplification only one sense amplifier is shown. Furthermore, it will be obvious to those skilled in the art that various other sensor and driver means may be employed to read or write the array of cells 10—10 and that numerous memory organizations are adaptable to the cell 10. One such memory organization is the 16k bit dynamic RAM memory described at pages 115 to 119 of the Apr. 28, 1977 issue of "Electronics".

While cells embodying the present invention have been described as operating in the P-channel mode, it will be obvious to those skilled in the art that N-channel cells may be used as well, provided the proper reverse polarities are applied, and that both N-channel and P-channel devices may be constructed using MNOS and other technologies, such as SNOS. Addtionally, while the memory array has been illustrated by a 3×4 matrix, the invention is not so limited, and the only limiting factor is the size of the chip on which the array of the novel cells 10—10 is formed.

Having thus described a preferred and alternative embodiments of the present invention:

1. A random access memory cell formed in a substrate of a given conductivity having a surface and at least one opposite conductivity region formed in the substrate for having signal information applied thereto, the cell comprising:
 a capacitor having one electrode thereof formed by the substrate for volatilely storing signal information;
 a first transistor, the first transistor having a channel formed in the substrate adjacent the capacitor electrode for transferring signal information from the opposite conductivity region via the channel to the capacitor;
 a second transistor, the second transistor having a channel formed in the substrate communicating with the said one electrode of the capacitor for transferring signal information therebetween and having an alterable conduction threshold and being selectively activated by the volatile signal information in the capacitor to a predetermined threshold state; and
 a third transistor, the third transistor having a channel formed in the substrate communicating with the second transistor channel for transferring signal information therebetween and cooperating with the opposite conductivity region and the second transistor for restoring signal information to the capacitor;
 the predetermined threshold state of the alterable threshold second transistor controlling the restoring of signal information to the capacitor.

2. The device of claim 1 wherein the second transistor is an insulated gate field-effect transistor comprising:
 a first layer of insulating material having a relatively low concentration of charge traps formed on the surface of the substrate;
 a second layer of insulating material having a relatively high concentration of charge traps formed on the first layer; and
 a layer of conductive material formed on the second layer.

3. In a random access memory cell formed in a semiconductor substrate of a given conductivity having an area of conductivity opposite to that of the substrate for having voltages applied thereto, the cell comprising a capacitor formed in the semiconductor substrate for volatilely storing different levels of charge therein and a first, address transistor formed in the semiconductor substrate for controlling the application of voltages from the diffused area to the capacitor to charge the capacitor, the improvement comprising:
 a second, alterable threshold field-effect transistor formed in the substrate;
 means for applying a poential across the capacitor for repelling substrate charge carriers attracted to the capacitor by the charge level thereon;
 means for applying a potential to the second transistor gate for attracting the charge carriers to the second transistor to establish the threshold voltage thereof;
 means for activating the first transistor for controlling the application of voltage from the opposite-conductivity area to the capacitor to recharge the capacitor; and
 a third transistor cooperating with the second transistor for establishing a conduction path to connect the opposite-conductivity area to the recharged capacitor to control the charge of the capacitor;
 the threshold voltage of the second transistor controlling the connection of the opposite-conductivity area to the capacitor and thereby determining the charge on the capacitor.

4. The memory cell of claim 1 wherein the cell structure is one of SNOS or MNOS.

5. The memory cell of claim 1 wherein the substrate includes first and second opposite conductivity regions associated with the first transistor and the third transistor, respectively.

6. A memory cell formed in a semiconductor substrate of predetermined conductivity type for storing binary information determined by the potential of a substrate region of the opposite conductivity type, comprising:

a capacitor (20) having one electrode formed in the substrate for volatilely storing binary digit information determined by the potential of the opposite conductivity substrate region;

first transistor means (18) for applying the substrate region potential to the capacitor substrate electrode (a) to selectively charge the capacitor to thereby volatilely store binary digit information in the capacitor during volatile operation of the cell and (b) to selectively charge the capacitor to initialize the capacitor preparatory to restoration of binary digit information to the capacitor;

alterable threshold transistor means (24) having a channel thereof formed in the substrate adjacent the substrate electrode of the capacitor and having the threshold thereof selectively altered by the charge on the capacitor for non-volatilely storing the capacitor binary digit information; and third transistor means (26) having a channel thereof formed in the substrate adjacent the channel of the alterable threshold transistor means and cooperating with the channel of the alterable threshold transistor means for applying a predetermined potential of the opposite conductivity substrate region, different from the initializing potential, to the substrate electrode of the capacitor, the application of the predetermined potential being controlled by the threshold voltage of the second transistor.

7. The memory cell of claim 6 wherein the cell structure is conductor-insulator-semiconductor substrate.

8. The memory cell of claim 16 wherein the structure of the cell is selected from MNOS or SNOS.

9. The memory cell of claim 6 wherein the substrate includes first and second opposite conductivity regions associated with the first transistor and the third transistor, respectively, the first opposite conductivity region potential being utilized during the volatile store and initializing functions and the second opposite conductivity region potential being utilized during the restore function.

10. A metal-oxide-semiconductor random access memory cell formed in a substrate of a given conductivity having at least one opposite conductivity region formed therein, comprising:

a capacitor having a first electrode formed within the substrate and a second electrode formed by the metal;

a first transistor means having a channel formed in the substrate on one side of and adjacent the capacitor electrode and having a gate electrode formed by the metal;

a second transistor means, the second transistor means having a gate electrode formed by the metal and a channel formed in the substrate communicating with the first capacitor electrode and having an alterable threshold voltage; and a third transistor having a gate electrode formed by the metal and a channel formed on the substrate communicating with the second transistor channel;

the capacitor and the first transistor means being activated by the application of predetermined voltages to the capacitor first electrode and to the first transistor gate electrode for connecting the opposite conductivity region to the capacitor first electrode to selectively transfer signal information to the capacitor by charging the capacitor, the selective charging being done (a) to effect volatile storage of binary information in the capacitor or (b) as an initial step in restoring binary information to the capacitor;

the capacitor and the second transistor being activated by the application of predetermined voltages to the capacitor first electrode and to the second transistor gate electrode for transferring the charge on the capacitor to the second transistor channel to selectively set the second transistor to a predetermined threshold voltage state to thereby store the signal information in the capacitor as the threshold voltage of the second transistor;

the capacitor and the third transistor being activated by the application of predetermined voltages to the capacitor first electrode and to the third capacitor gate electrode, and the second transistor being selectively activated by a predetermined voltage applied to the gate electrode thereof, all for connecting the opposite conductivity region to the capacitor first electrode for restoring signal information to the capacitor, the connection being controlled by the threshold voltage of the second transistor.

11. The memory cell of claim 10 wherein the cell structure is one of SNOS or MNOS.

* * * * *

UNITED STATES PATENT OFFICE
CERTIFICATE OF CORRECTION

Patent No. 4,175,291          Dated November 20, 1979

Inventor(s) Wendell Spence

It is certified that error appears in the above-identified patent and that said Letters Patent are hereby corrected as shown below:

Column 11, Claim 8, line 44, "claim 16" should read
-- claim 6 -- .

*Signed and Sealed this*

*Nineteenth* Day of *February 1980*

[SEAL]

Attest:

SIDNEY A. DIAMOND

*Attesting Officer*      *Commissioner of Patents and Trademarks*